(12) United States Patent
Kim

(10) Patent No.: US 7,539,227 B2
(45) Date of Patent: May 26, 2009

(54) EXTERNAL CAVITY SURFACE EMITTING LASER DEVICE HAVING A PLURALITY OF QUANTUM WELLS

(75) Inventor: Taek Kim, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 111 days.

(21) Appl. No.: 11/267,263

(22) Filed: Nov. 7, 2005

(65) Prior Publication Data

US 2006/0140235 A1 Jun. 29, 2006

(30) Foreign Application Priority Data

Dec. 28, 2004 (KR) .................. 10-2004-0113924

(51) Int. Cl.
*H01S 3/04* (2006.01)
*H01S 5/00* (2006.01)

(52) U.S. Cl. .............. 372/45.01; 372/43.01; 372/44.01; 372/45.012

(58) Field of Classification Search .............. 372/43.01, 372/44.01, 45.01, 45.012
See application file for complete search history.

(56) References Cited

U.S. PATENT DOCUMENTS

2006/0233213 A1* 10/2006 Choa et al. .................. 372/64

* cited by examiner

*Primary Examiner*—Kenneth A Parker
*Assistant Examiner*—Hrayr A. Sayadian
(74) *Attorney, Agent, or Firm*—Buchanan Ingersoll & Rooney PC

(57) ABSTRACT

A high-power surface emitting laser capable of recycling electrons and holes by inserting a tunnel junction between quantum wells is provided. The laser includes an active layer with a plurality of quantum wells and a plurality of barriers alternately sandwiched between the plurality of quantum wells wherein a tunnel junction is inserted into the barrier between the quantum wells.

25 Claims, 5 Drawing Sheets

EXTERNAL CAVITY SURFACE EMITTING LASER DEVICE HAVING A PLURALITY OF QUANTUM WELLS

CROSS-REFERENCE TO RELATED PATENT APPLICATION

This application claims the benefit of Korean Patent Application No. 10-2004-0113924, filed on Dec. 28, 2004, in the Korean Intellectual Property Office, the disclosure of which is incorporated herein in its entirety by reference.

BACKGROUND OF THE DISCLOSURE

1. Field of the Disclosure

The present disclosure relates to a surface emitting laser having a plurality of quantum wells, and more particularly, to a high-power surface emitting laser capable of recycling electrons and holes by inserting a tunnel junction between quantum wells.

2. Description of the Related Art

A vertical external cavity surface emitting laser (VECSEL) typically includes a substrate, a lower distributed Bragg reflector (DBR) layer, an active layer, and an upper DBR layer. Light generated in the active layer is repeatedly reflected back and forth between the upper and lower DBR layers. Light amplified in the active layer is output as a laser beam.

As research into fabrication of laser-based televisions using a laser has recently received more attention, the demand for compact high-power lasers with output power greater than several watts increases. In a surface emitting laser, such as a VESCEL or VCSEL, a gain region should be large to provide high output power, and current injected into the active layer must have a uniform spatial distribution to provide single transverse mode oscillation.

However, when an aperture area is increased to provide high output power, current density is high at the edges of an active layer but is low at the center because current flows more easily through the edges of the active layer where the resistance is low. The uneven distribution of current density makes it difficult to achieve single transverse mode oscillation.

Meanwhile, increasing the size of the gain region can be achieved by increasing the number of quantum wells without increasing the aperture area. FIG. 1 is a cross-sectional view of a multi-quantum well (MQW) structure for a conventional surface emitting laser. Referring to FIG. 1, the conventional surface emitting laser includes first and second DBR layers 31 and 36 respectively having a multi-layer structure, a p-cladding layer 32 and an n-cladding layer 35 located to face the first and second DBR layers 31 and 36, respectively, a plurality of barriers 33, and a plurality of quantum wells 34 alternately sandwiched between the plurality of barriers 33. The p-cladding layer 32 and the n-cladding layer 35 respectively provide holes and electrons to the quantum wells 34 where the electrons and the holes recombine to generate light.

The first and second DBR layers 31 and 36 bounce back and forth the light generated in the quantum wells 34, forming a standing wave. To maximize laser oscillation efficiency, the quantum wells 34 should be located at an anti-node (the point of maximum displacement) of the standing wave. As the number of quantum wells increases by one, a cavity length between the first and second DBR layers 31 and 36 increases by a ½ wavelength. When the entire length of cavity is 4 to 5 times greater than the wavelength, electric resistance is excessively high since the barriers 33 between the quantum wells 34 are undoped, resulting in a sharp decrease in emission efficiency. For a laser optically pumped by a pump laser, increasing the number of quantum wells suffers no degradation in emission efficiency. Conversely, for an electrically pumped laser, increasing the number of quantum wells results in degradation of emission efficiency.

SUMMARY OF THE DISCLOSURE

The present invention may provide a high-power surface emitting laser designed to increase the size of a gain region by increasing the number of quantum wells without limit, which is possible by inserting a tunnel junction into a barrier layer between quantum wells.

According to an aspect of the present invention, there may be provided a laser including an active layer with a plurality of quantum wells and a plurality of barriers alternately sandwiched between the plurality of quantum wells, wherein a tunnel junction is inserted into the barriers between the quantum wells.

The tunnel junction is a junction between a p+ semiconductor layer doped with a p− dopant and an n+ semiconductor layer doped with an n−dopant, and the doping concentration of the p+ semiconductor layer and the n+ semiconductor layer is in the range of $1\times10^{18}/cm^3$ to $1\times10^{19}/cm^3$. The p+ semiconductor layer and the n+ semiconductor layer are made of materials containing p+ (Al)(In)GaAs and n+ (Al)(In)GaAs, respectively. One tunnel junction may be disposed for every two quantum wells. The thickness of the tunnel junction may be in the range of approximately 20 to 30 nm.

The laser may further include a strain compensation layer that is disposed near the quantum well which compensates a strain exerted on the quantum wells. In this instance, the strain compensation layer is formed of at least one of GaAsP, InGaP and GaAsN.

According to another aspect of the present invention, there may be provided a surface emitting laser including: a substrate; a lower distributed Bragg reflector (DBR) layer formed on the substrate; an active layer that is formed on the lower DBR layer and generates light of a specific wavelength; and an upper DBR layer formed on the active layer, wherein the active layer includes a plurality of quantum wells and a plurality of barriers alternately formed between the plurality of quantum wells, and a tunnel junction is inserted into the barrier between the quantum wells.

The surface emitting laser may further include an external mirror that is spaced at a predetermined distance from the upper DBR layer and outputs a portion of the light generated in the active layer while reflecting the remaining portion for reabsorption by the active layer. The laser may further include a second harmonic generation (SHG) crystal that is disposed between the upper DBR layer and the external mirror and doubles the frequency of the light generated in the active layer.

According to another aspect of the present invention, there may be provided a surface emitting laser including: a transparent substrate; a lower distributed Bragg reflector (DBR) layer formed on the transparent substrate; an active layer that is formed on the lower DBR layer and generates light of a specific wavelength; an upper DBR layer formed on the active layer; and an external mirror that is disposed under the transparent substrate to face the transparent substrate and outputs a portion of the light generated in the active layer while reflecting the remaining portion for re-absorption by the active layer, wherein the active layer includes a plurality of quantum wells and a plurality of barriers alternately formed between the plurality of quantum wells, and a tunnel junction is inserted into the barrier between the quantum wells.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS

Figure 1:
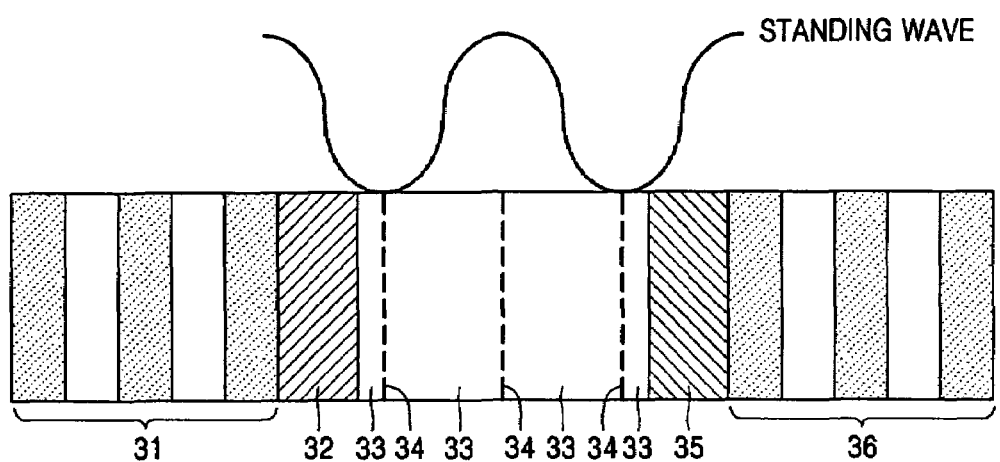
FIG. 1 is a cross-sectional view of a multi-quantum well (MQW) structure for a conventional surface emitting laser.
Figure 2:
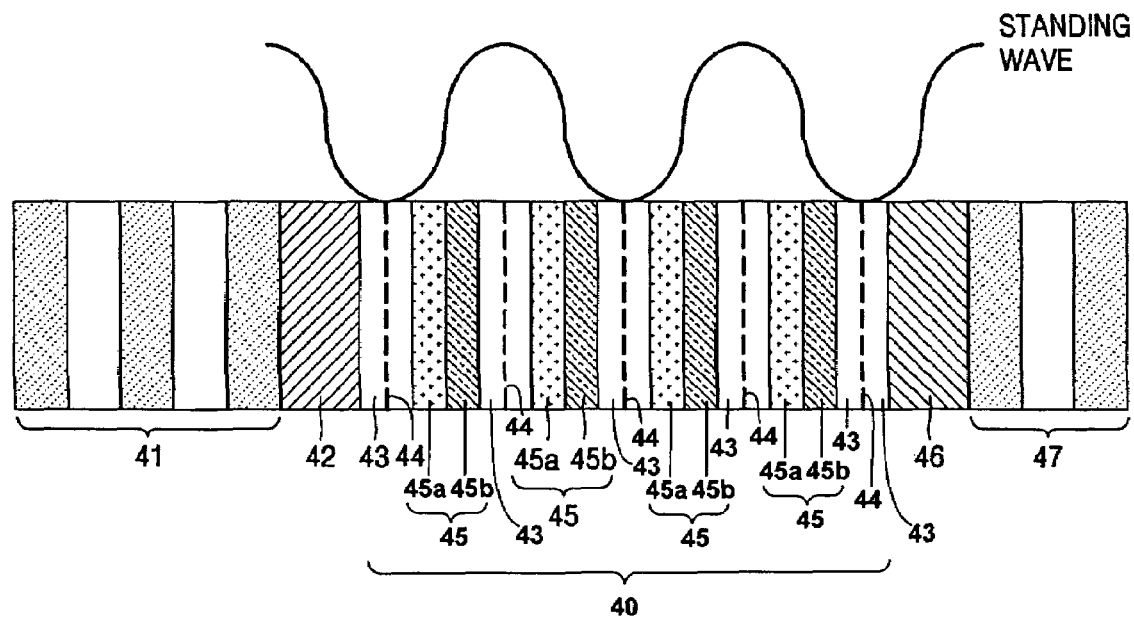
FIG. 2 is a cross-sectional view of a MQW structure for a surface emitting laser according to an embodiment of the present invention.

FIG. 2 is a cross-sectional view of a multi-quantum well (MQW) structure for a surface emitting laser according to an embodiment of the present invention. Referring to FIG. 2, the surface emitting laser includes first and second distributed Bragg reflector (DBR) layers 41 and 47 respectively having a multi-layer structure, a p-cladding layer 42 and an n-cladding layer 46 located to face the first and second DBR layers 41 and 47, respectively, and an active layer 40. The active layer 40 includes a plurality of barriers 43 and a plurality of quantum wells 44 alternately formed between the p- and n-cladding layers 42 and 46. As described earlier, the p- and n-cladding layers 42 and 46 respectively provide holes and electrons to the quantum wells 44.

Light generated by recombining electrons and holes in the quantum wells 44 is reflected back and forth between the first and second DBR layers 41 and 47 to form a standing wave. To maximize laser oscillation efficiency, the quantum wells 44 are located at anti-nodes (the points of maximum displacement) of the standing wave. For example, while the quantum wells 44 may be made of indium gallium arsenide (InGaAs), the barriers 43 may be made of undoped aluminum GaAs (AlGaAs) or undoped GaAs. The p-cladding layer 42 may be made of p-AlGaAs or p-GaAs. The n-cladding layer 46 may be made of n-AlGaAs or n-GaAs.

Unlike in a conventional surface emitting laser, a tunnel junction 45 is formed between the quantum wells 44. The tunnel junction 45 is a junction between an n+ semiconductor layer 45a doped with a high concentration of n– dopant and a p+ semiconductor layer 45b doped with a high concentration of p– dopant. It is generally known that when the doping concentration is increased by increasing the amount of p- and n-type impurities, electrons can tunnel through an energy barrier ("tunneling effect") due to a change in state at the interface between p- and n-type semiconductor layers. The tunneling effect allows current to flow between the two semiconductor layers. In this case, as the doping concentration increases, the amount of resistance generated when electrons move through the energy barrier decreases due to a decrease in bandgap. However, when the doping concentration is excessively high, laser performance may be degraded due to diffusion of the impurities into the surrounding barriers 43. Thus, it is important to select a suitable doping concentration. The doping concentration of the n+ semiconductor layer 45a and the p+ semiconductor layer 45b in the tunnel junction 45 may be suitably selected in the range of about $1 \times 10^{18}/cm^3$ to $1 \times 10^{19}/cm^3$ in this exemplary embodiment. Furthermore, the tunnel junction 45 should be so thin as to generate tunneling. The thickness of the tunnel junction 45 may be selected suitably in the range of about 20 nm to about 30 nm in this exemplary embodiment. The p+ semiconductor layer 45b and the n+ semiconductor layer 45a may be made of p+ (Al)(In)GaAs and n+ (Al)(In)GaAs, respectively.

Figure 3:
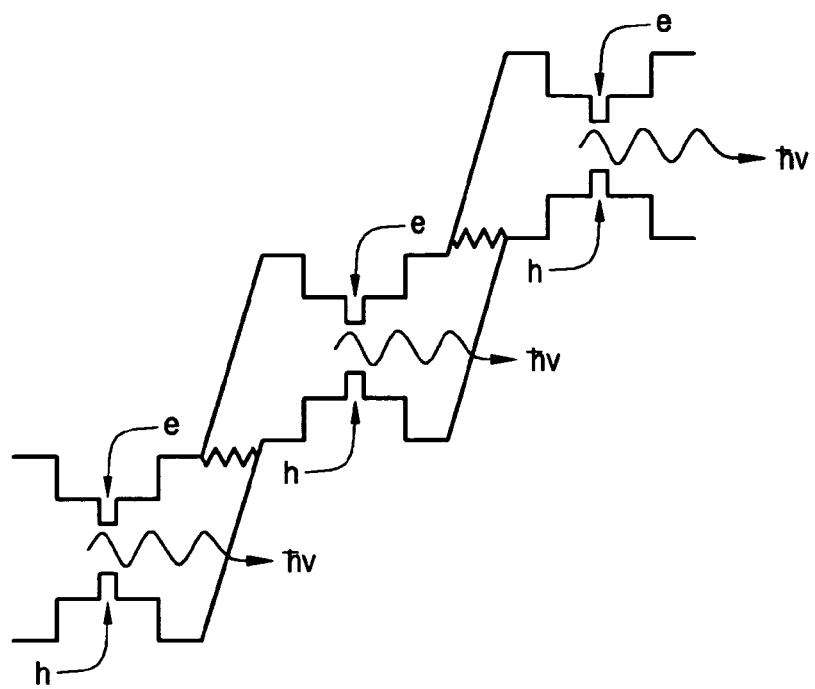
FIG. 3 is an energy band diagram for explaining a principle underlying the present invention.

FIG. 3 is an energy band diagram for explaining a principle underlying the present invention. Referring to FIG. 3, electrons and holes respectively injected from the n-cladding layer 46 and the p-cladding layer 42 recombine to generate light in one quantum well and then change into holes and electrons, respectively, as they pass through the tunnel junction 45. The holes and electrons passing through the tunnel junction 45 recombine again to generate light in a next quantum well. In this way, a laser device of the present invention, unlike a conventional laser device, uses the tunnel junction 45 to increase the number of quantum wells 44 without limit. Using any number of quantum wells results in a wider gain region for an aperture of the same area, thereby facilitating high power operation.

While FIG. 2 shows that one tunnel junction 45 is disposed between each set of adjacent quantum wells 44, several tunnel junctions 45 may be omitted. However, even though one tunnel junction 45 is disposed in each barrier 43 between adjacent quantum wells 44 in certain embodiments, electric resistance does not increase significantly so as to affect the emission efficiency of the laser.

Figure 4:
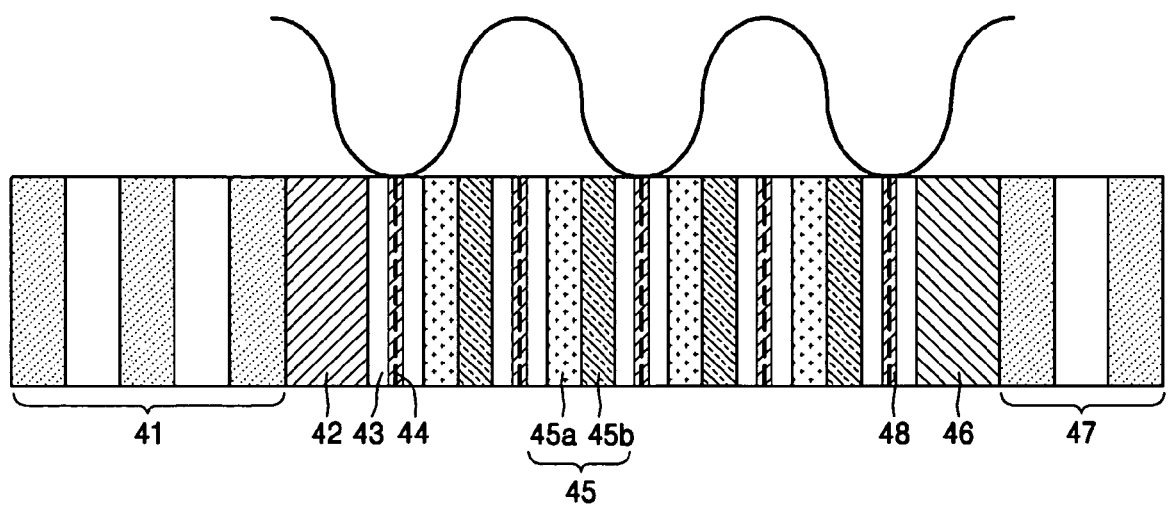
FIG. 4 is a cross-sectional view of a MQW structure of a surface emitting laser according to another embodiment of the present invention.

FIG. 4 is a cross-sectional view of a MQW structure of a surface emitting laser according to another embodiment of the present invention. Referring to FIG. 4, the MQW structure additionally includes a strain compensation layer 48 to compensate for compressive strain induced by quantum wells 44. That is, the remaining components including a tunnel junction 45 have the same structure as their counterparts in the MQW structure of FIG. 2. While FIG. 4 shows that the strain compensation layer 48 is located immediately adjacent to the quantum well 44, it may be separated from the quantum well 44. For example, the strain compensation layer 48 may be disposed between the quantum well 44 and the tunnel junction 45 or adjacent to the tunnel junction 45. The strain compensation layer 48 may be formed of a material such as GaAsP, InGaP, or GaAsN.

In the MQW structure according to the present embodiment, since multiple quantum wells 44 are connected in series, output power increases as well as the driving voltage. An increase in driving voltage is not desirable for a typical low-power laser. However, in the case of a high-power laser for a next-generation laser TV, high voltage is typically used to achieve high output power. A recently developed high-power VECSEL requires a high operating voltage. Thus, an increase in operating voltage is not significant.

Figure 5:
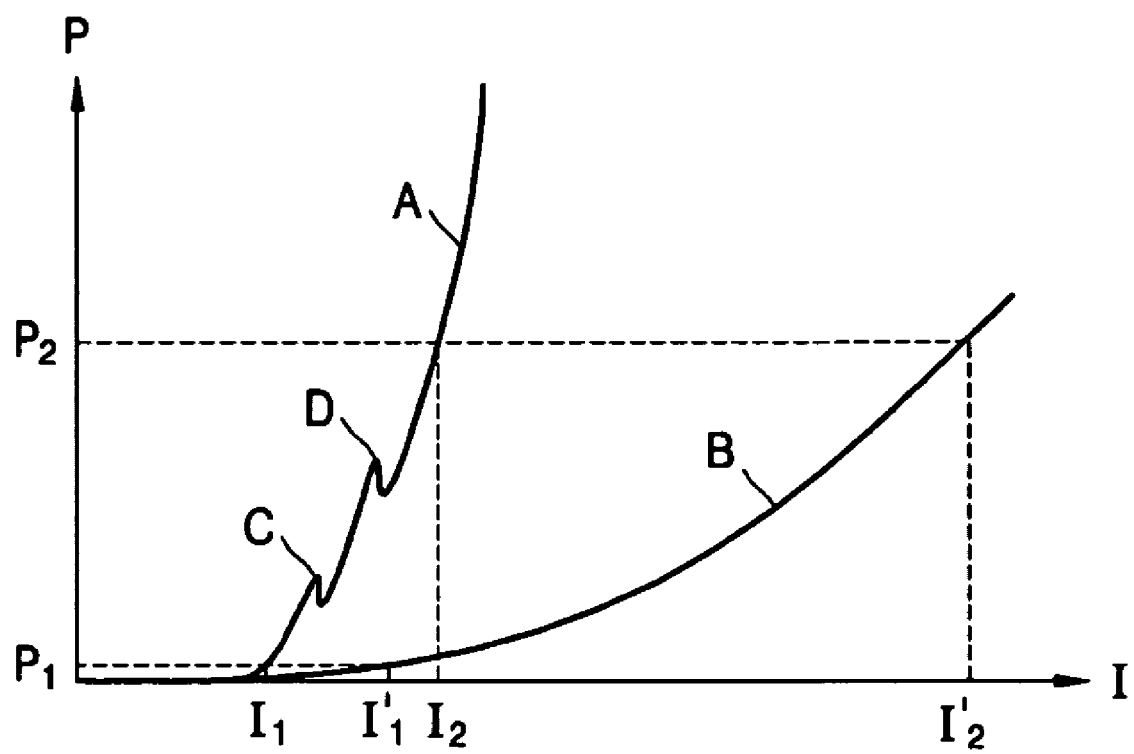
FIG. 5 is a graph illustrating current-power (I-P) characteristics of a conventional laser and a laser according to the present invention.

In the MQW structure where the multiple quantum wells 44 are connected in series through the tunnel junction 45, the driving voltage increases but the amount of current decreases compared to other lasers having the same output power. FIG. 5 is a graph illustrating a comparison of current-power (I-P) characteristics between a conventional laser and a laser according to the present invention. A curve "A" in FIG. 5 represents I-P characteristics of the laser according to the present invention. A curve "B" represents I-P characteristics of the conventional laser. As is evident from the curve "A", in the laser of the present invention, output power sharply increases as the current slightly increases at relatively high driving voltage. To generate a digital signal, a modulator used for a laser TV or optical communication equipment periodically changes laser power by adjusting the magnitude of current within a specific interval. When laser power changes between $P_1$ and $P_2$, current varies over a long interval from $I_1'$ to $I_2'$ for the conventional laser but over a very short interval from $I_1$ to $I_2$ for the laser of the present invention. For example, a current range from 0 to 10 A in the conventional laser may decrease to a range from 0 to 3 A in the laser of the present invention. Thus, the present invention allows high-speed signal modulation.

As is evident from curve "A", slightly irregular power curves C and D appear due to the presence of the tunnel junction. The irregular power curves may be highly detrimental to the performance of a laser generating low-power pulses. For example, when a signal is generated at several tens of milliwatts of power, an imprecise signal may be output due to the presence of irregular output curves C and D. In particular, when the magnitude of the signal to be output coincides with the position of irregular power curve (C or D), a distorted signal is output. However, a laser for a laser TV requiring high power greater than several watts is less affected by the irregular power curves than others. Furthermore, when a signal is modulated within a large interval ($P_1$ to $P_2$) so irregular portions of the signal are completely included in the interval as shown in FIG. 5, the signal is little affected by the irregular power curves C and D.

Figure 6:
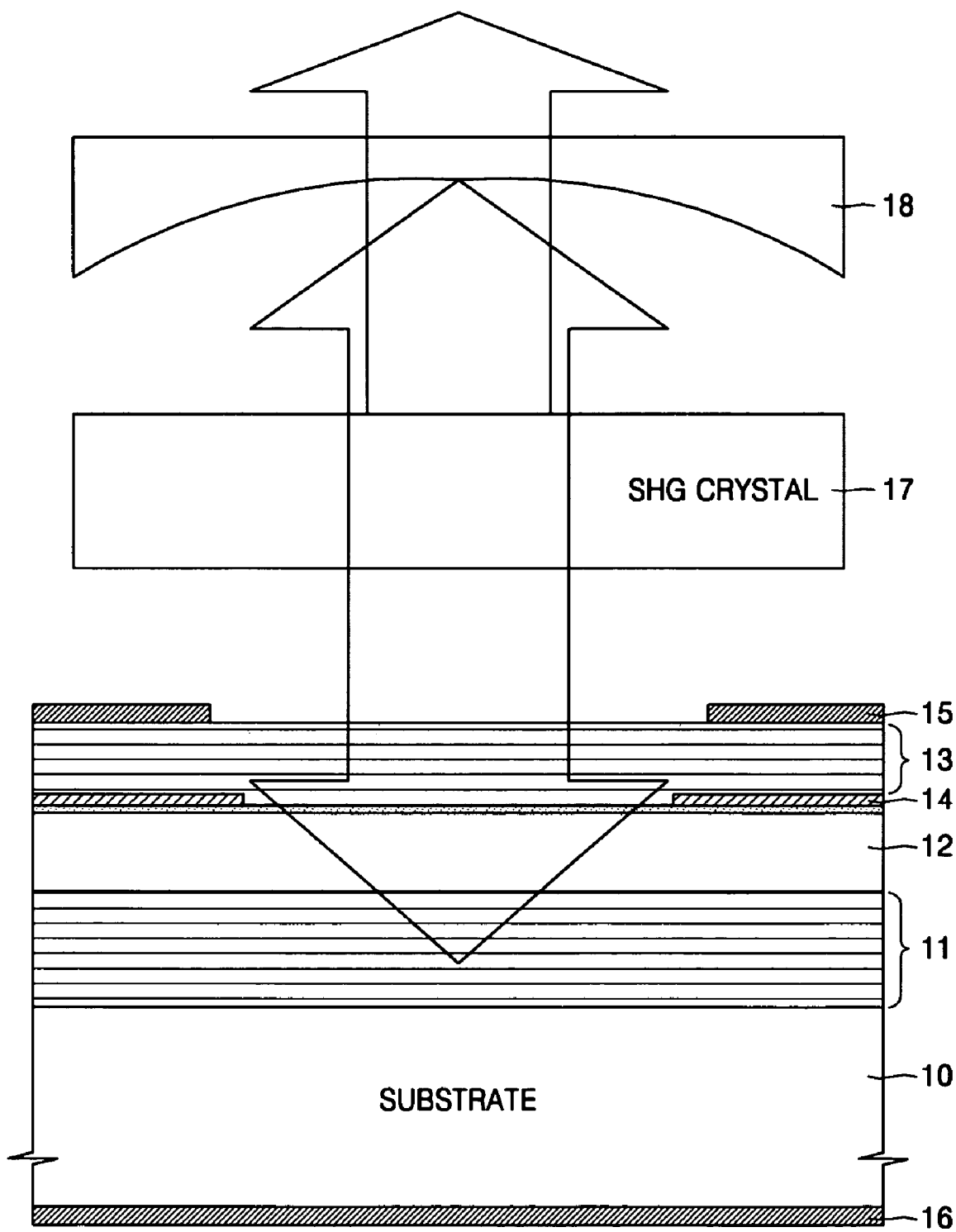
FIG. 6 is a schematic diagram of a vertical external cavity surface emitting laser (VECSEL) according to an embodiment of the present invention.

FIG. 6 is a schematic diagram of a vertical external cavity surface emitting laser (VECSEL) according to an embodiment of the present invention using the MQW structure of FIG. 2 or 4. Referring to FIG. 6, the VECSEL includes a substrate 10, a lower DBR layer 11, an active layer 12 with the MQW structure of FIG. 2 or 4, an upper DBR layer 13, and an external concave mirror 18. The VECSEL further includes a second harmonic generation (SHG) crystal 17 that is disposed between the upper DBR layer 13 and the external concave mirror 18 and doubles the frequency of light generated in the active layer 12. The SHG crystal 17 may be made of Potassium Titanyl Phosphate (KTP), Lithium Niobate (LiNbO$_3$), periodically poled LiNbO$_3$ (PPLN), Potassium Tantalate-Niobate (KTN), or Potassium Niobate (KNbO$_3$). Furthermore, selective oxidation may be performed to form an oxide layer 14 under the upper DBR layer 13, limiting the diameter of an aperture in the active layer 12, which is a light emitting region, to less than a predetermined value.

Here, a cavity is formed between the lower and upper DBR layers 11 and 13 and between the lower DBR layer 11 and the external mirror 18. Light generated in the active layer 12 is repeatedly reflected back and forth between the lower and upper DBR layers 11 and 13 and between the lower DBR layer 11 and the external mirror 18. A portion of the light of a specific wavelength amplified in the active layer 12 is output as a laser beam through the external mirror 18 while the remaining portion is reflected back for optical pumping.

Figure 7:
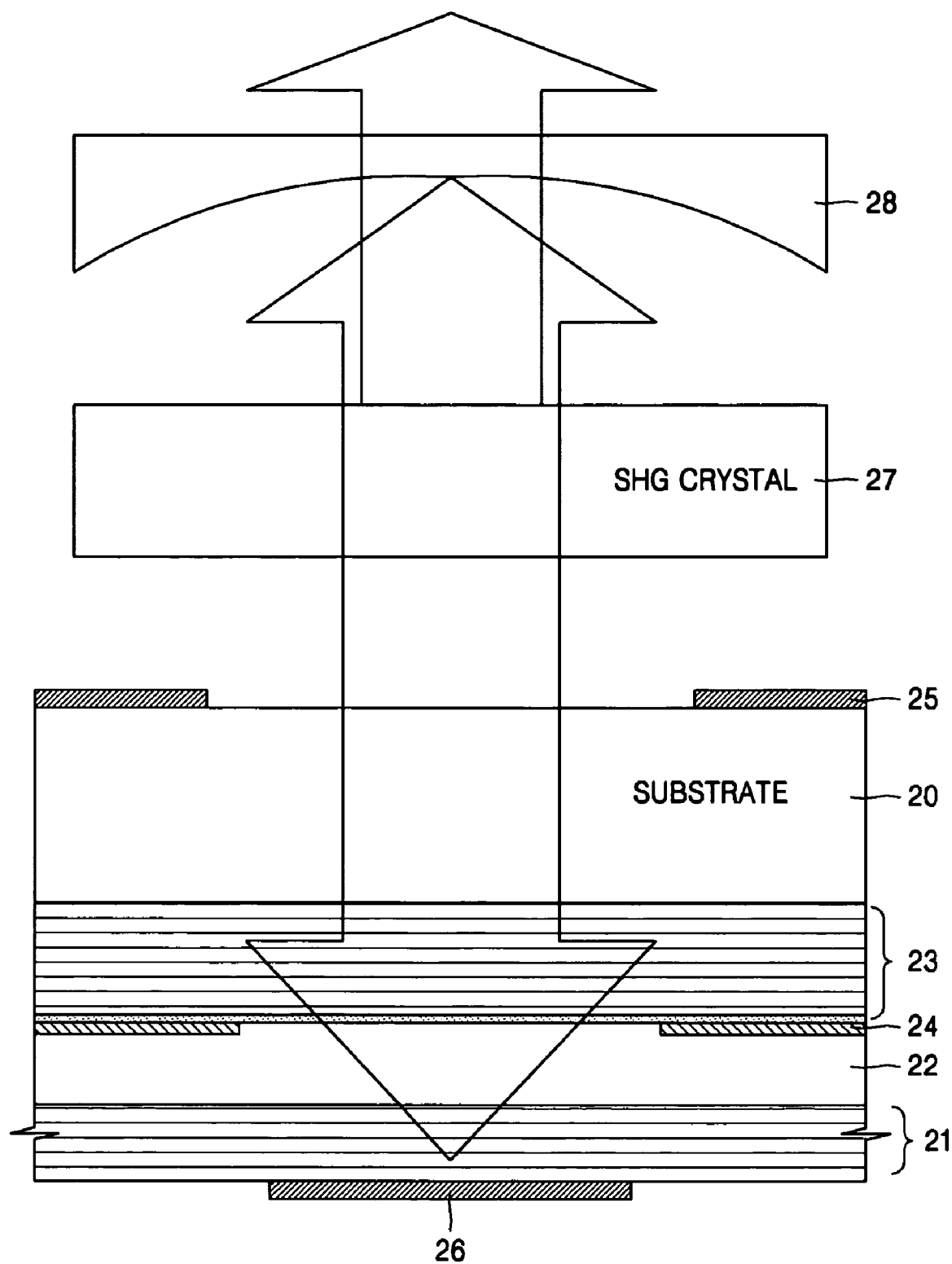
FIG. 7 is a schematic diagram of a VECSEL according to another embodiment of the present invention.

However, since horizontal electric resistance is significantly higher than vertical electric resistance in the VECSEL of FIG. 6, current density is not distributed uniformly across the entire active layer 12 and is highest at edges of the aperture in the active layer 12. The uneven distribution of current density makes it difficult to achieve single transverse mode oscillation. FIG. 7 is a schematic diagram of a VECSEL according to another embodiment of the present invention designed to provide uniform distribution of current density.

Referring to FIG. 7, the VECSEL includes a lower DBR layer 21, an active layer 22 with the MQW structure of FIG. 2 or 4, an upper DBR layer 23, a transparent substrate 20, and an external concave mirror 28. The VECSEL further includes a second harmonic generation (SHG) crystal 27 that is disposed between the transparent substrate 20 and the external concave mirror 28 and doubles the frequency of light generated in the active layer 22. Furthermore, selective oxidation is performed to form an oxide layer 24 under the upper DBR layer 23, limiting the diameter of an aperture in the active layer 22 to less than a predetermined value. In the VECSEL having the above-mentioned construction, current applied from an electrode 25 is sufficiently dispersed in a horizontal direction as it flows along a long path of the transparent substrate 20, thereby achieving uniform distribution of current density.

While the active layer 22, the upper DBR layer 23, and the transparent substrate 20 appear to be formed sequentially on the lower DBR layer 21, the upper DBR layer 23, the active layer 22, and the lower DBR layer 21 are sequentially formed on the transparent substrate 20 and the external mirror 28 is formed under the transparent substrate 20.

As described above, the present invention uses a tunnel junction to increase the number of quantum wells without limit. By using any number of quantum wells without limit, the size of a gain region can be increased for an aperture of the same area, thereby facilitating high power operation. Since the slope of power with respect to current is large in the exemplary embodiments, the present invention provides high-speed modulation. By decreasing operating current while increasing high operating voltage, it further is possible to readily design a driving current.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A laser including an active layer, which includes a plurality of quantum wells, a plurality of barriers alternately sandwiched between the plurality of quantum wells, respectively, and a plurality of tunnel junctions respectively inserted into the plurality of barriers between the quantum wells such that at least two of the plurality of barriers have a respective one of the plurality of tunnel junctions inserted therein.

2. The laser of claim 1, wherein each tunnel junction is a junction between a p+ semiconductor layer doped with a p– dopant and an n+ semiconductor layer doped with an n– dopant, and the doping concentration of the p+ semiconductor layer and the n+ semiconductor layer is in the range of about $1\times10^{18}/cm^3$ to $1\times10^{19}/cm^3$.

3. The laser of claim 2, wherein the p+ semiconductor layer and the n+ semiconductor layer are made of materials containing p+ (Al)(In)GaAs and n+ (Al)(In)GaAs, respectively.

4. The laser of claim 1, wherein one tunnel junction is disposed in each barrier between adjacent quantum wells.

5. The laser of claim 1, wherein the thickness of each tunnel junction is in the range of about 20 to 30 nm.

6. The laser of claim 1, further comprising a strain compensation layer that is disposed near at least one of the quantum wells and compensates a strain exerted on the at least one quantum well.

7. The laser of claim 6, wherein the strain compensation layer is formed of at least one of GaAsP, InGaP and GaAsN.

8. The laser of claim 1, further comprising:
a substrate;

a lower distributed Bragg reflector (DBR) layer formed on the substrate; and
an upper DBR layer formed on the active layer,
wherein the active layer is formed on the lower DBR layer and generates light of a specific wavelength, and
wherein the laser is a surface emitting laser.

9. The laser of claim 8, wherein each tunnel junction is a junction between a p+ semiconductor layer doped with a p–dopant and an n+ semiconductor layer doped with an n–dopant, and the doping concentration of the p+ semiconductor layer and the n+ semiconductor layer is in the range of about $1\times10^{18}/cm^3$ to $1\times10^{19}/cm^3$.

10. The laser of claim 9, wherein the p+ semiconductor layer and the n+ semiconductor layer are made of materials containing p+ (Al)(In)GaAs and n+ (Al)(In)GaAs, respectively.

11. The laser of claim 8, wherein one tunnel junction is disposed in each barrier between adjacent quantum wells.

12. The laser of claim 8, wherein the thickness of each tunnel junction is in the range of about 20 to 30 nm.

13. The laser of claim 8, further comprising an external mirror that is spaced up a predetermined distance from the upper DBR layer and outputs a portion of the light generated in the active layer while reflecting the remaining portion of the light toward the active layer for reabsorption by the active layer.

14. The laser of claim 13, further comprising a second harmonic generation (SHG) crystal that is disposed between the upper DBR layer and the external mirror and doubles the frequency of the light generated in the active layer.

15. The laser of claim 1, further comprising:
a transparent substrate;
a lower distributed Bragg reflector (DBR) layer formed on the transparent substrate; and
an upper DBR layer formed on the active layer,
wherein the active layer is formed on the lower DBR layer,
wherein the laser further comprises an external mirror that is disposed under the transparent substrate to face the transparent substrate and outputs a portion of the light generated in the active layer while reflecting the remaining portion of the light toward the active layer for reabsorption by the active layer, and
wherein the laser is a surface emitting laser.

16. The laser of claim 15, wherein each tunnel junction is a junction between a p+ semiconductor layer doped with a p–dopant and an n+ semiconductor layer doped with an n–dopant, and the doping concentration of the p+ semiconductor layer and the n+ semiconductor layer is in the range of about $1\times10^{18}/cm^3$ to $1\times10^{19}/cm^3$.

17. The laser of claim 16, wherein the p+ semiconductor layer and the n+ semiconductor layer are made of materials containing p+ (Al)(In)GaAs and n+ (Al)(In)GaAs, respectively.

18. The laser of claim 15, wherein the thickness of each tunnel junction is in the range of about 20 to 30 nm.

19. The laser of claim 15, further comprising a second harmonic generation (SHG) crystal that is disposed between the transparent substrate and the external mirror and doubles the frequency of the light generated in the active layer.

20. The laser of claim 1, further comprising a plurality of strain compensation layers respectively disposed near the plurality of quantum wells, the plurality of strain compensation layers being configured to compensate for a strain exerted on the plurality of quantum wells, respectively.

21. The laser of claim 8, further comprising a strain compensation layer that is disposed near at least one of the quantum wells and compensates a strain exerted on the at least one quantum well.

22. The laser of claim 8, further comprising a plurality of strain compensation layers respectively disposed near the plurality of quantum wells, the plurality of strain compensation layers being configured to compensate for a strain exerted on the plurality of quantum wells, respectively.

23. The laser of claim 15, wherein one tunnel junction is disposed in each barrier between adjacent quantum wells.

24. The laser of claim 15, further comprising a strain compensation layer that is disposed near at least one of the quantum wells and compensates a strain exerted on the at least one quantum well.

25. The laser of claim 15, further comprising a plurality of strain compensation layers respectively disposed near the plurality of quantum wells, the plurality of strain compensation layers being configured to compensate for a strain exerted on the plurality of quantum wells, respectively.

* * * * *